(12) United States Patent
Colinge et al.

(10) Patent No.: US 11,104,573 B2
(45) Date of Patent: Aug. 31, 2021

(54) SEMICONDUCTOR ARRANGEMENT WITH ONE OR MORE SEMICONDUCTOR COLUMNS

(71) Applicant: TAIWAN SEMICONDUCTOR MANUFACTURING COMPANY LIMITED, Hsin-Chu (TW)

(72) Inventors: Jean-Pierre Colinge, Hsinchu (TW); Ta-Pen Guo, Taipei (TW); Chih-Hao Wang, Baoshan Township (TW); Carlos H. Diaz, Mountain View, CA (US)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 34 days.

(21) Appl. No.: 16/416,545

(22) Filed: May 20, 2019

(65) Prior Publication Data
US 2019/0337800 A1    Nov. 7, 2019

Related U.S. Application Data

(60) Continuation of application No. 15/705,359, filed on Sep. 15, 2017, now Pat. No. 10,294,101, which is a
(Continued)

(51) Int. Cl.
| | |
|---|---|
| *H01L 21/308* | (2006.01) |
| *B82Y 10/00* | (2011.01) |
| *B82Y 40/00* | (2011.01) |
| *H01L 29/66* | (2006.01) |
| *H01L 29/775* | (2006.01) |

(Continued)

(52) U.S. Cl.
CPC ............ *B82Y 10/00* (2013.01); *B82Y 40/00* (2013.01); *H01L 29/0676* (2013.01); *H01L 29/66439* (2013.01); *H01L 29/775* (2013.01); *H01L 29/42392* (2013.01)

(58) Field of Classification Search
CPC .......... H01L 29/66666; H01L 29/7827; H01L 29/7828; H01L 21/0332; H01L 21/3081; H01L 29/42392; H01L 29/0676; H01L 29/78642; H01L 29/66439; H01L 29/775;
(Continued)

(56) References Cited

U.S. PATENT DOCUMENTS

| | | | |
|---|---|---|---|
| 8,241,838 B2 * | 8/2012 | Yoshino | H01L 21/0337 430/314 |
| 2012/0040528 A1 * | 2/2012 | Kim | H01L 21/0338 438/675 |
| 2014/0322915 A1 * | 10/2014 | Lee | H01L 21/0337 438/701 |

\* cited by examiner

*Primary Examiner* — Eric A. Ward
(74) *Attorney, Agent, or Firm* — Cooper Legal Group, LLC

(57) ABSTRACT

A semiconductor arrangement includes a substrate region and a first semiconductor column projecting from the substrate region. The semiconductor arrangement includes a second semiconductor column projecting from the substrate region and adjacent the first semiconductor column. The second semiconductor column is separated a first distance from the first semiconductor column along a first axis. The semiconductor arrangement includes a third semiconductor column projecting from the substrate region and adjacent the first semiconductor column. The third semiconductor column is separated a second distance from the first semiconductor column along a second axis that is substantially perpendicular to the first axis. The second distance is different than the first distance.

20 Claims, 19 Drawing Sheets

Related U.S. Application Data division of application No. 14/287,155, filed on May 26, 2014, now Pat. No. 9,764,950, which is a continuation-in-part of application No. 13/969,114, filed on Aug. 16, 2013, now Pat. No. 9,978,863.

(51) Int. Cl.
 *H01L 29/06* (2006.01)
 *H01L 29/423* (2006.01)

(58) Field of Classification Search
 CPC .... H01L 21/027–0338; H01L 21/3088; B82Y 10/00; B82Y 40/00
 See application file for complete search history.

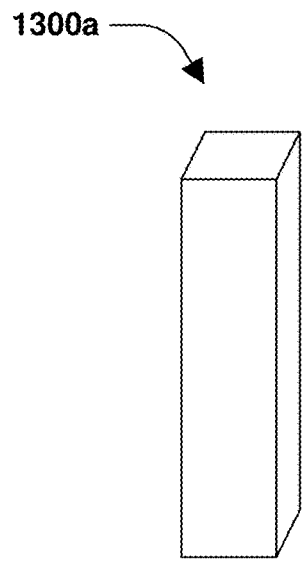
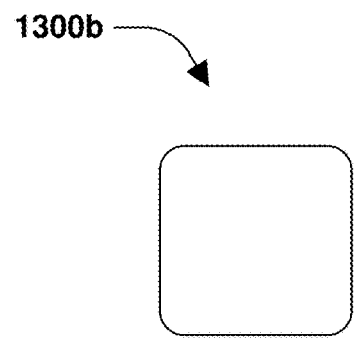
FIG. 13b
FIG. 13a
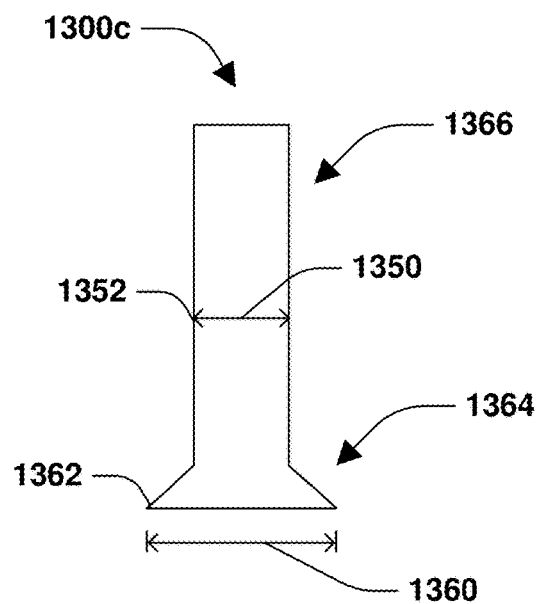
FIG. 13c
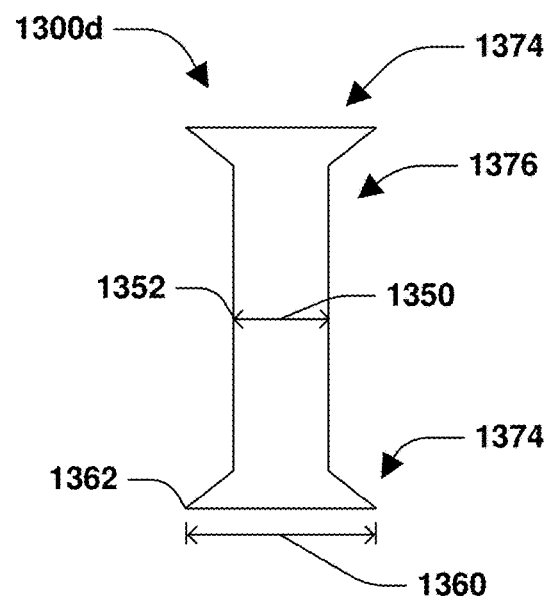
FIG. 13d

US 11,104,573 B2

SEMICONDUCTOR ARRANGEMENT WITH ONE OR MORE SEMICONDUCTOR COLUMNS

RELATED APPLICATION(S)

This application is a continuation of and claims priority to U.S. patent application Ser. No. 15/705,359, titled "Semiconductor Arrangement with One or More Semiconductor Columns" and filed on Sep. 15, 2017, which is a division of and claims priority to U.S. patent application Ser. No. 14/287,155, titled "Semiconductor Arrangement with One or More Semiconductor Columns" and filed on May 26, 2014, which is a continuation-in-part of U.S. patent application Ser. No. 13/969,114, titled "Semiconductor Arrangement with One or More Semiconductor Columns" and filed on Aug. 16, 2013. U.S. patent application Ser. Nos. 15/705,359, 14/287,155 and 13/969,114 are incorporated herein by reference.

BACKGROUND

In a vertical transistor, a vertical column is formed over a substrate. A gate electrode is formed to encircle the vertical column, with the encircled portion of the vertical column forming the channel of the vertical transistor. The vertical column may be a vertical nano-wire formed of a semiconductor material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13a illustrates a portion of a semiconductor arrangement, in accordance with some embodiments.

FIG. 13b illustrates a portion of a semiconductor arrangement, in accordance with some embodiments.

FIG. 13c illustrates a portion of a semiconductor arrangement, in accordance with some embodiments.

FIG. 13d illustrates a portion of a semiconductor arrangement, in accordance with some embodiments.

DETAILED DESCRIPTION

Figure 1:
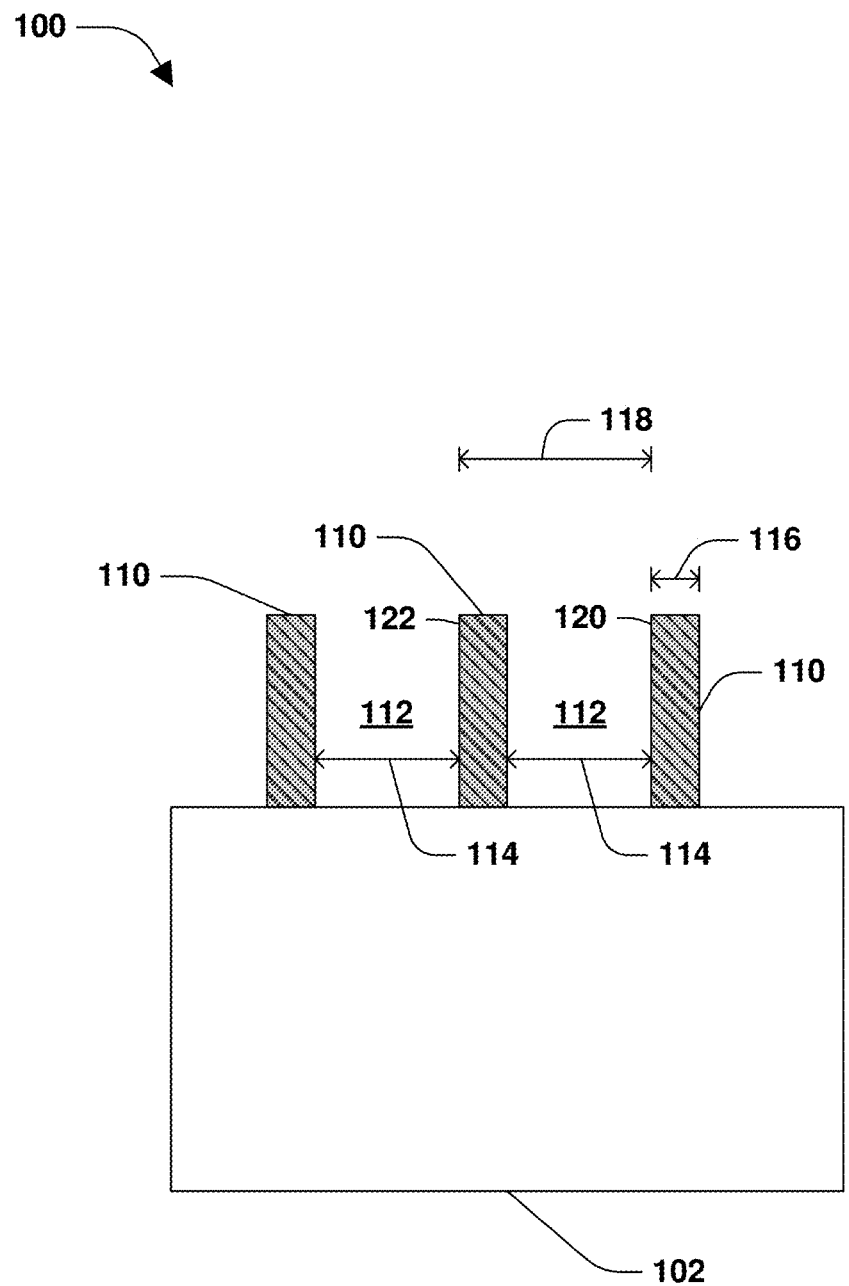
FIG. 1 illustrates a portion of a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly One or more techniques for forming a semiconductor arrangement and resulting structures formed thereby are provided herein. Some embodiments of the present disclosure have one or a combination of the following features and/or advantages.

FIG. 1 is a sectional view illustrating a portion of a semiconductor arrangement 100 according to some embodiments. In an embodiment, the semiconductor arrangement 100 comprises a substrate region 102. The substrate region 102 comprises any number of materials, such as, for example, silicon, polysilicon, germanium, etc., alone or in combination. According to some embodiments, the substrate region 102 comprises an epitaxial layer, a silicon-on-insulator (SOI) structure, etc. According to some embodiments, the substrate region 102 corresponds to a wafer or a die formed from a wafer.

According to some embodiments, the semiconductor arrangement 100 includes a first mask material 110. In an embodiment, the first mask material 110 is formed over the substrate region 102. The first mask material 110 comprises any number of materials, such as, for example, an oxide, silicon dioxide ($SiO_2$), etc. According to some embodiments, the first mask material 110 is formed by deposition, epitaxial growth, thermal growth, etc.

According to some embodiments, the first mask material 110 is patterned to form one or more first openings 112. In some embodiments, the first openings 112 comprise a distance 114 between adjacent portions of the first mask material 110. In some embodiments, the distance 114 is about 20 nanometers (nm) to about 40 nm. In an embodiment, the distance 114 is about 30 nm. In some embodiments, the first mask material 110 comprises a thickness 116 of about 5 nm to about 15 nm. In an embodiment, the thickness 116 is about 10 nm. In some embodiments, a pitch distance 118 comprises a distance separating an end 120 of the first mask material 110 to an end 122 of an adjacent first mask material 110. According to some embodiments, the pitch distance 118 is about 25 nm to about 55 nm. In an embodiment, the pitch distance 118 is about 40 nm.

Figure 2:
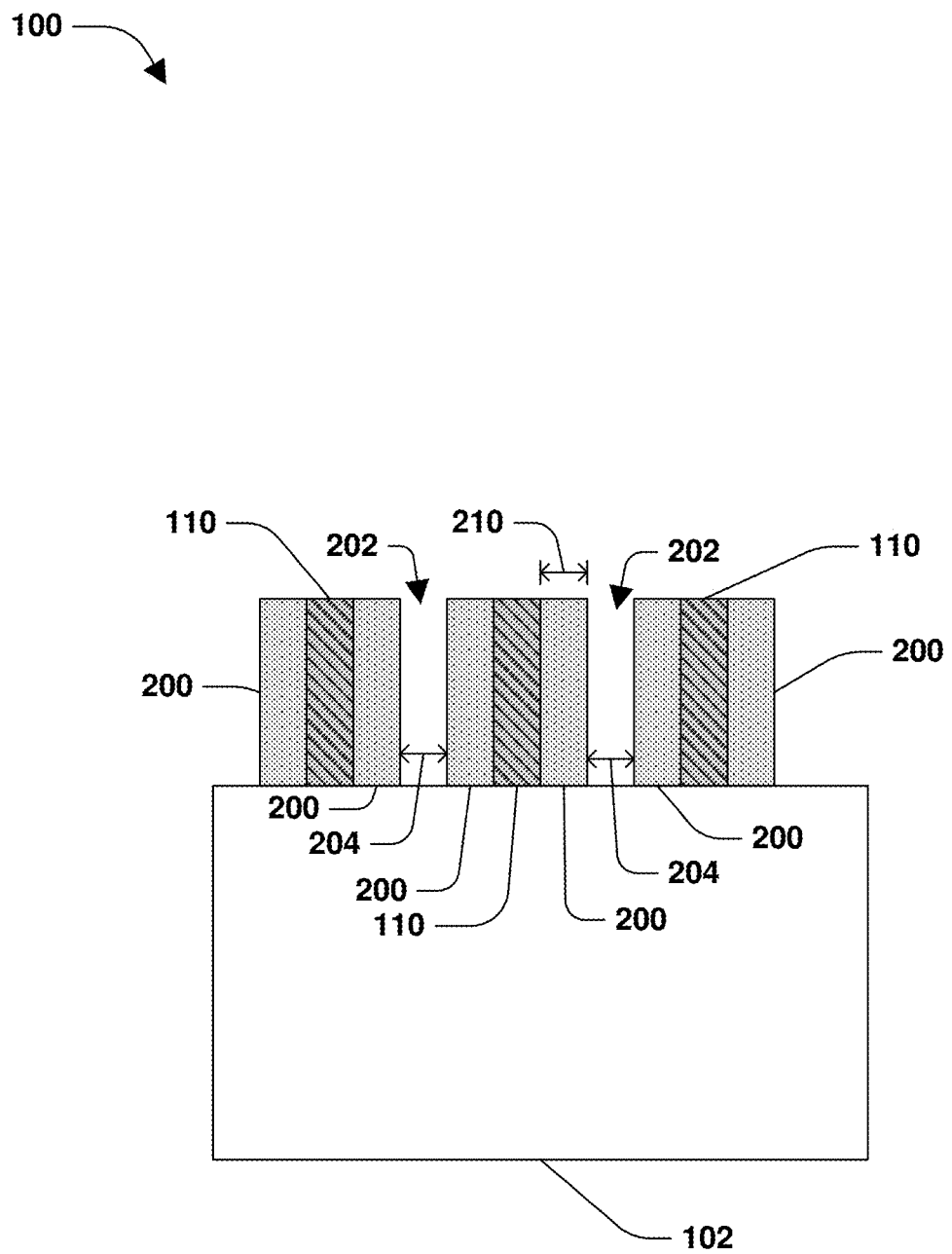
FIG. 2 illustrates a portion of a semiconductor arrangement, in accordance with some embodiments.

Turning to FIG. 2, in an embodiment, a second mask material 200 is formed. In an embodiment, the second mask material 200 is formed over the substrate region 102. The second mask material 200 comprises any number of materials, such as, for example, a nitride, $Si_3N_3$, etc. In some embodiments, the second mask material 200 comprises a different material than the first mask material 110. In an embodiment, the first mask material 110 comprises $SiO_2$ and the second mask material 200 comprises $Si_3N_3$. In an embodiment, the first mask material 110 comprises $Si_3N_3$ and the second mask material 200 comprises $SiO_2$. According to some embodiments, the second mask material 200 is formed by deposition, epitaxial growth, etc.

According to some embodiments, the second mask material 200 is patterned to form one or more second openings 202. In some embodiments, the second openings 202 comprise a distance 204. In some embodiments, the distance 204 is about 5 nm to about 15 nm. In an embodiment, the distance 204 is about 10 nm. In some embodiments, the second mask material 200 comprises a thickness 210 of about 5 nm to about 15 nm. In an embodiment, the thickness 210 is about 10 nm. In some embodiments, the second mask material 200 is patterned so as to be positioned on both sides of the first mask material 110.

Figure 3:
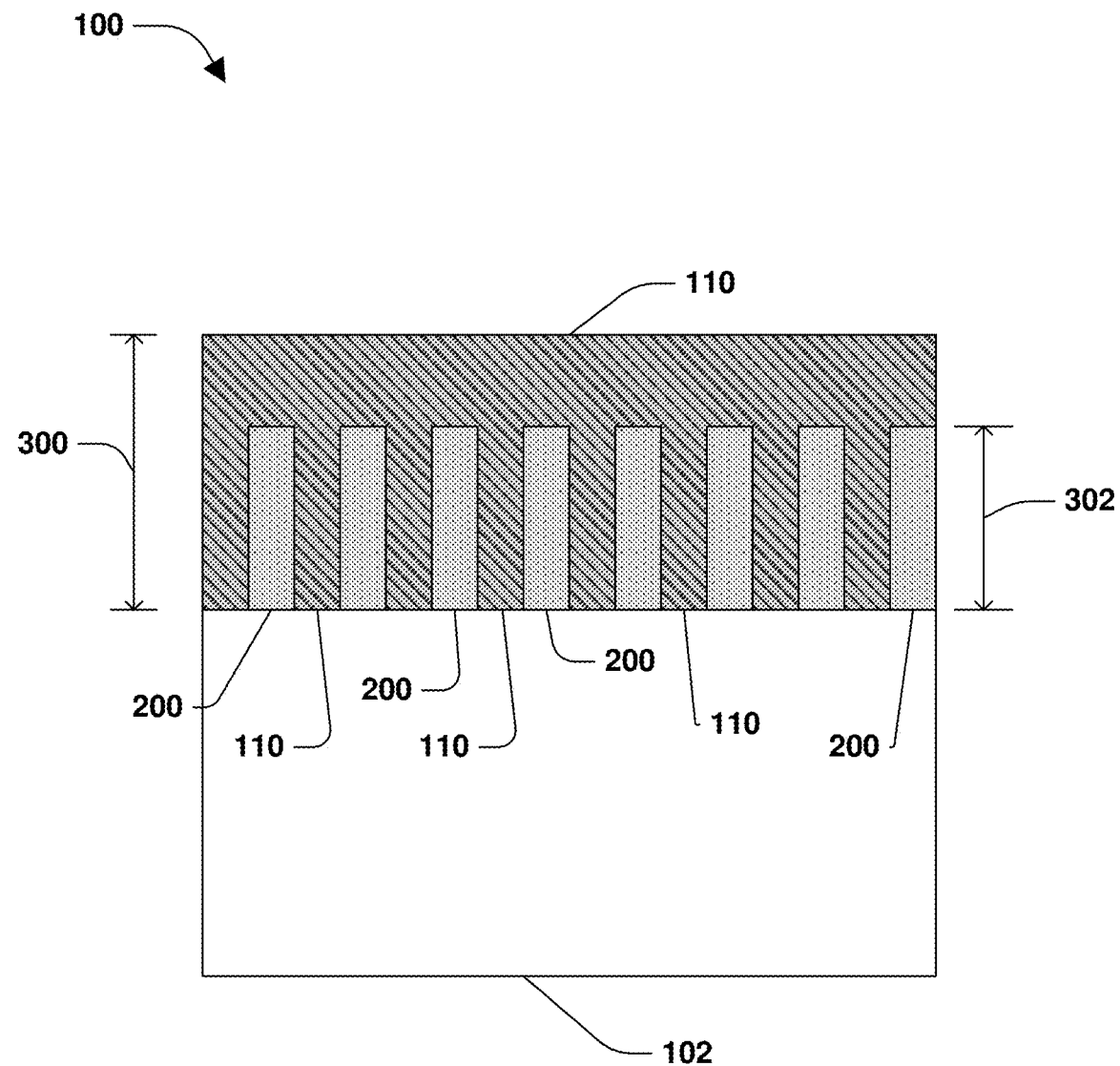
FIG. 3 illustrates a portion of a semiconductor arrangement, in accordance with some embodiments.

Turning now to FIG. 3, in an embodiment, the first mask material 110 is formed over the substrate region 102, the second mask material 200 and existing portions of the first mask material 110 illustrated in FIG. 1 and FIG. 2. In an embodiment, the first mask material 110 is formed within the second openings 202 (illustrated in FIG. 2). In an embodiment, the first mask material 110 includes a height 300 that is larger than a height 302 of the second mask material 200. According to some embodiments, the first mask material 110 is formed by deposition, epitaxial growth, etc.

Figure 4A:
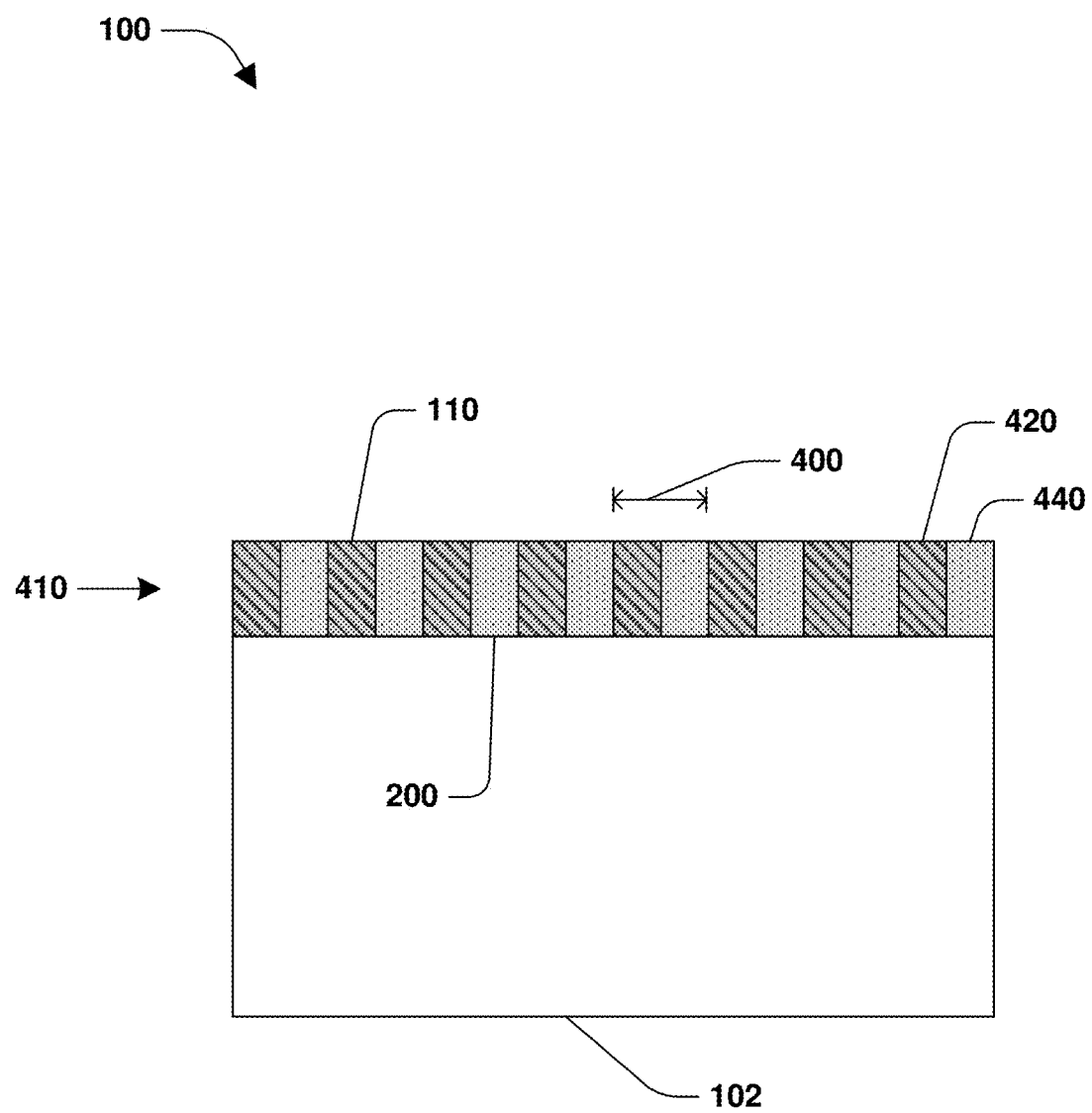
FIG. 4a illustrates forming a first mask region associated with forming a semiconductor arrangement, in accordance with some embodiments.

Turning now to FIG. 4a, in an embodiment, the first mask material 110 and the second mask material 200 are planarized. In some embodiments, the first mask material 110 and the second mask material 200 are planarized by a chemical-mechanical planarization (CMP) process. According to some embodiments, the first mask material 110 and second mask material 200 comprise a pitch distance 400. In an embodiment, the pitch distance 400 comprises a thickness of the first mask material 110 and the second mask material 200. In some embodiments, the pitch distance 400 is about 10 nm to about 30 nm. In an embodiment, the pitch distance 400 is about 20 nm. According to some embodiments, the pitch distance 400 is about one half of the pitch distance 118 illustrated in FIG. 1. Accordingly, a pitch distance between adjacent or neighboring instances of a masking material depicted in FIG. 4a is about one half of that depicted in FIG. 1.

Figure 4B:
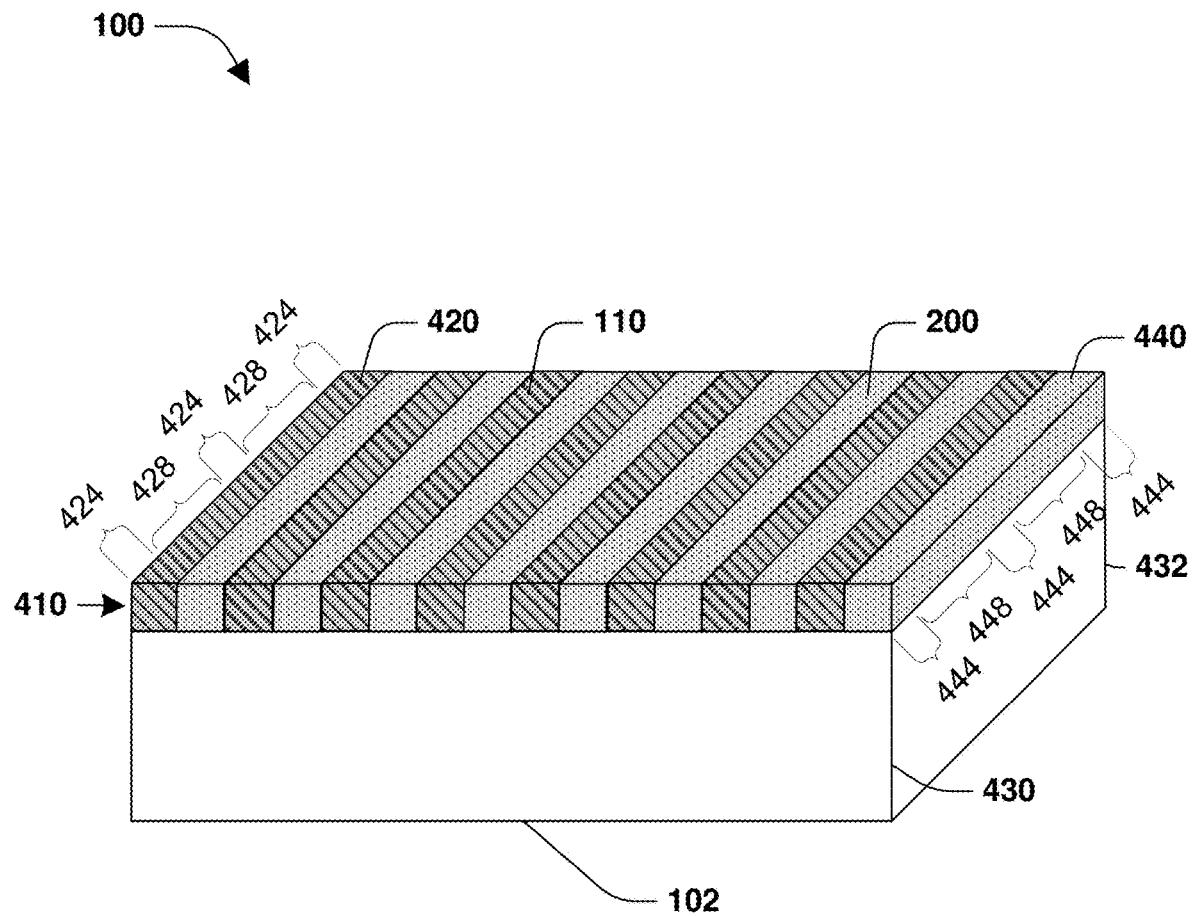
FIG. 4b illustrates forming a first mask region associated with forming a semiconductor arrangement, in accordance with some embodiments.

FIG. 4b is a perspective view of the embodiment illustrated in FIG. 4a, where the first mask material 110 and the second mask material 200 are collectively said to define or comprise a first mask region 410. According to some embodiments, the first mask region 410 is thus said to comprise first mask portions 420, comprised of the first mask material 110 of FIG. 4a, and second mask portions 440, comprised of the second mask material 200 of FIG. 4a. According to some embodiments, at least one of the first mask portions 420 or the second mask portions 440 extend across the substrate region 102 of the semiconductor arrangement 100 between a first end 430 and a second end 432. According to some embodiments, the first mask portions 420 comprise first areas 424 and third areas 428. According to some embodiments, the second mask portions 440 comprise second areas 444 and fourth areas 448.

Figure 5A:
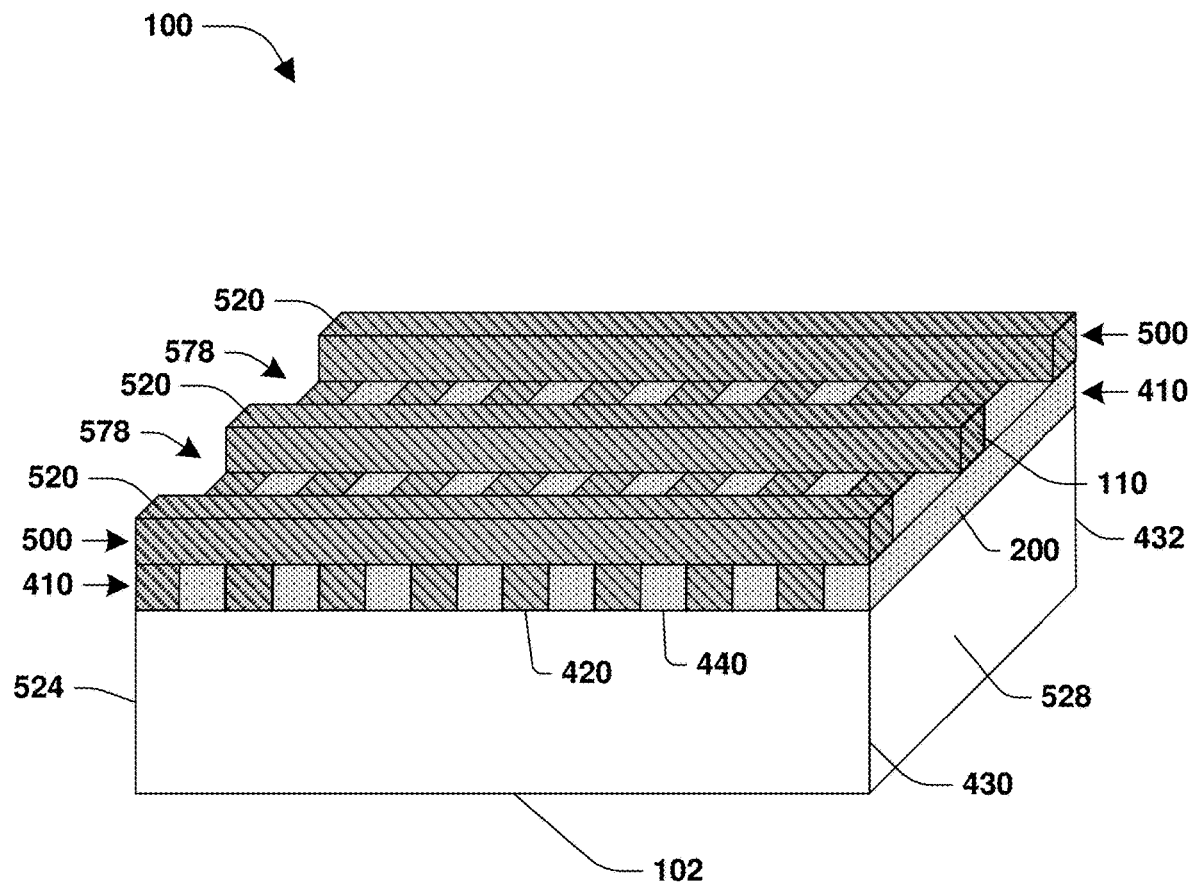
FIG. 5a illustrates forming a second mask region associated with forming a semiconductor arrangement, in accordance with some embodiments.
Figure 5B:
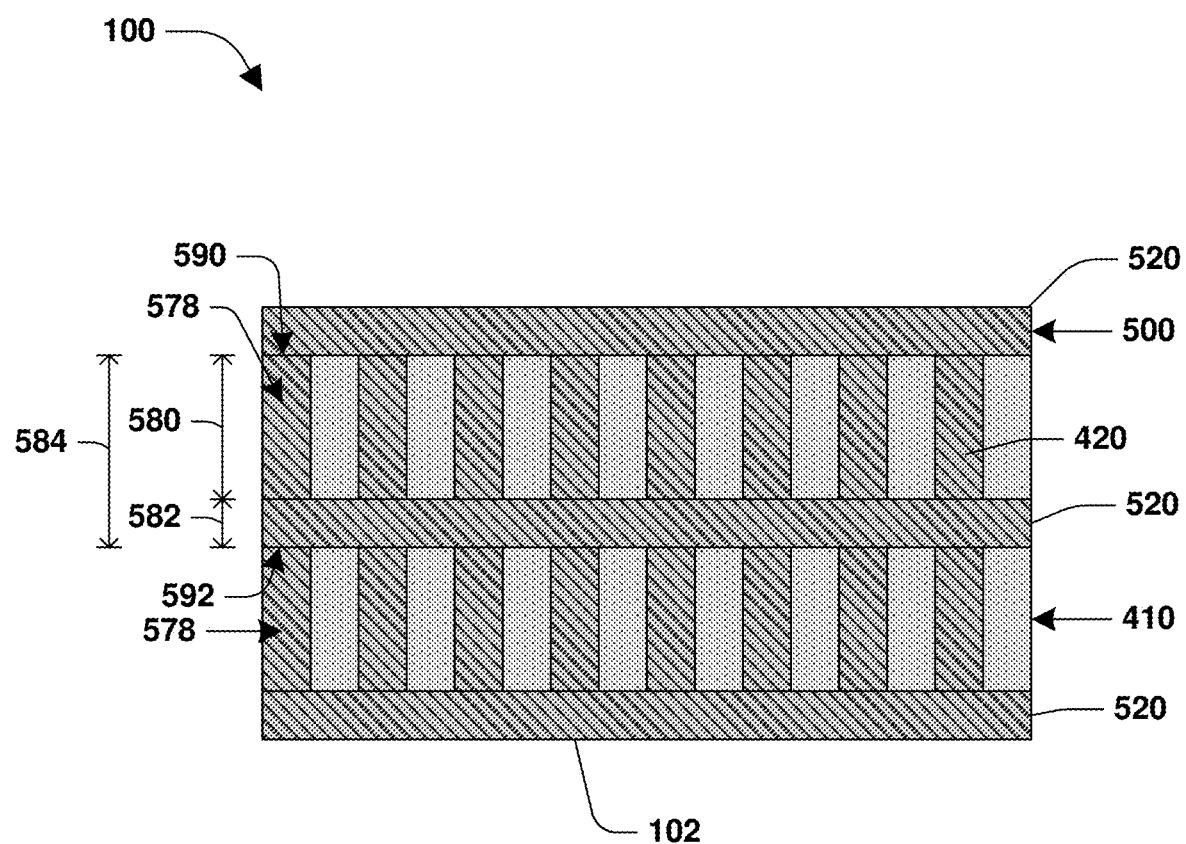
FIG. 5b illustrates forming a second mask region associated with forming a semiconductor arrangement, in accordance with some embodiments.

Turning now to FIGS. 5a and 5b, in an embodiment, a second mask region 500 is formed over the first mask region 410. In some embodiments, the second mask region 500 is formed in a similar manner as the first mask region 410. According to some embodiments, the second mask region 500 comprises third mask portions 520. In some embodiments, the third mask portions 520 are comprised of the first mask material 110. In an embodiment, the third mask portions 520 extend across the first mask region 410 of the semiconductor arrangement 100 between a third end 524 and a fourth end 528. According to some embodiments, the third mask portions 520 extend in a substantially perpendicular direction with respect to the first mask portions 420 and the second mask portions 440.

According to some embodiments, the first mask material 110 of the second mask region 500 is patterned to form openings 578 between the third mask portions 520. In some embodiments, as illustrated in FIG. 5b, the openings 578 comprise a distance 580 between adjacent portions of the third mask portions 520. In some embodiments, the distance 580 is about 20 nm to about 40 nm. In an embodiment, the distance 580 is about 30 nm. In some embodiments, the third mask portions 520 comprise a thickness 582 of about 5 nm to about 15 nm. In an embodiment, the thickness 582 is about 10 nm. In some embodiments, a pitch distance 584 comprises a distance separating an end 590 of one of the third mask portions 520 to an end 592 of an adjacent third mask portion 520. According to some embodiments, the pitch distance 584 is about 25 nm to about 55 nm. In an embodiment, the pitch distance 584 is about 40 nm.

Figure 6:
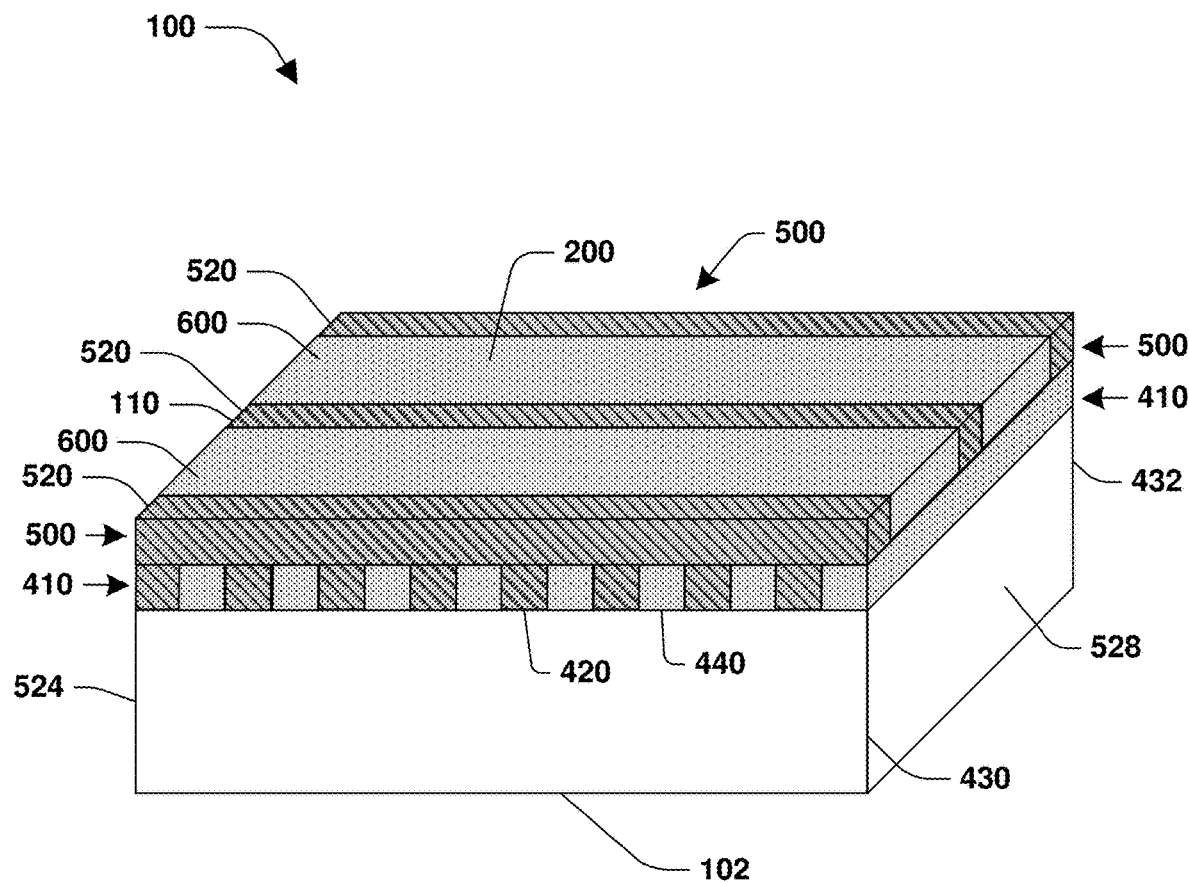
FIG. 6 illustrates forming a second mask region associated with forming a semiconductor arrangement, in accordance with some embodiments.

Turning now to FIG. 6, in an embodiment, fourth mask portions 600 are formed as part of the second mask region 500 such that the second mask region 500 comprises the third mask portions 520 and the fourth mask portions 600. In some embodiments, the fourth mask portions 600 are comprised of the second mask material 200. In an embodiment, the fourth mask portions 600 extend across the first mask region 410 of the semiconductor arrangement 100 between the third end 524 and the fourth end 528. According to some embodiments, the fourth mask portions 600 extend in a substantially perpendicular direction with respect to the first mask portions 420 and the second mask portions 440. In an embodiment, the fourth mask portions 600 are formed within the openings 578, illustrated in FIGS. 5a and 5b, between the third mask portions 520.

Figure 7A:
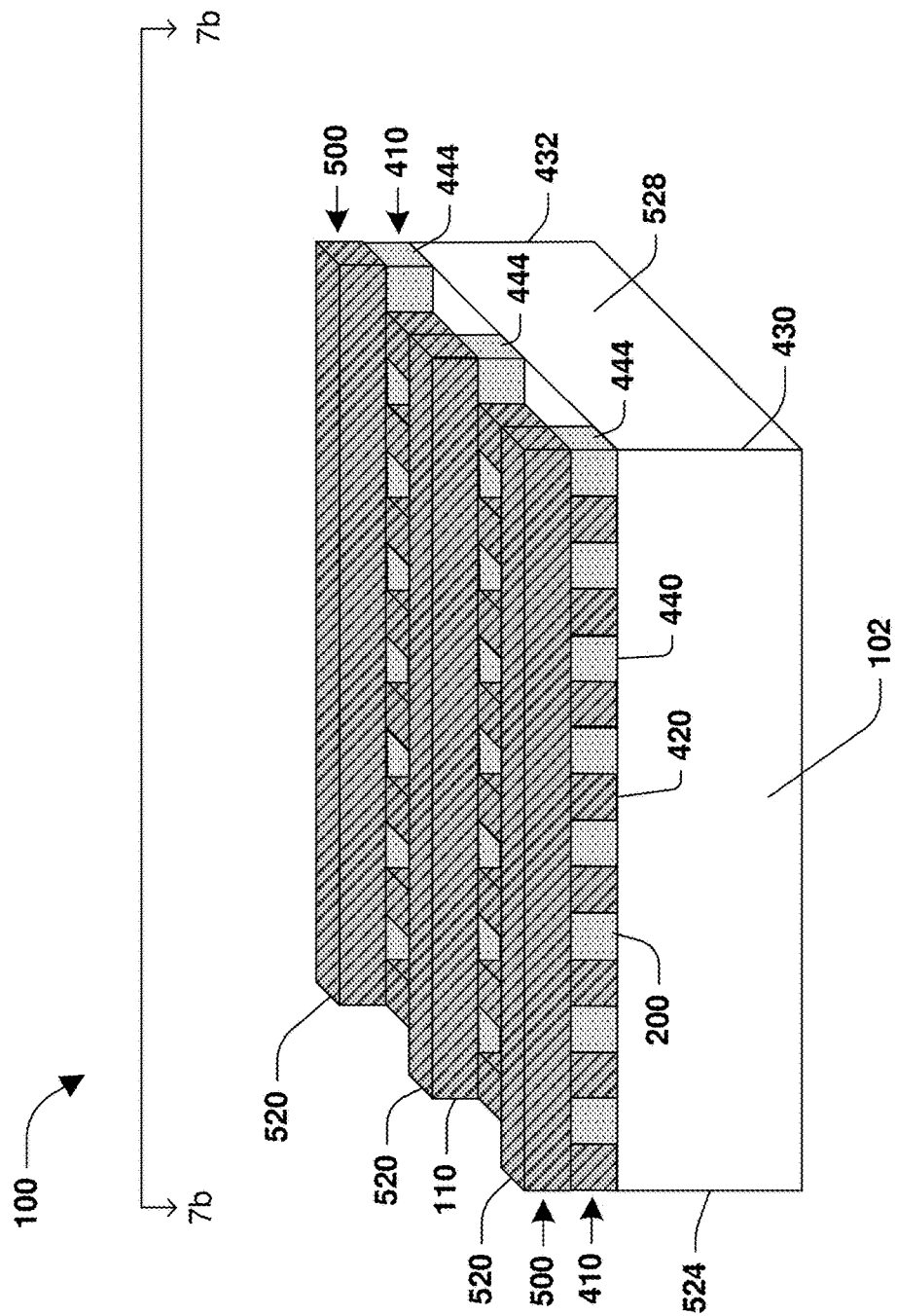
FIG. 7a illustrates patterning a first mask region and a second mask region associated with forming a semiconductor arrangement, in accordance with some embodiments.
Figure 7B:
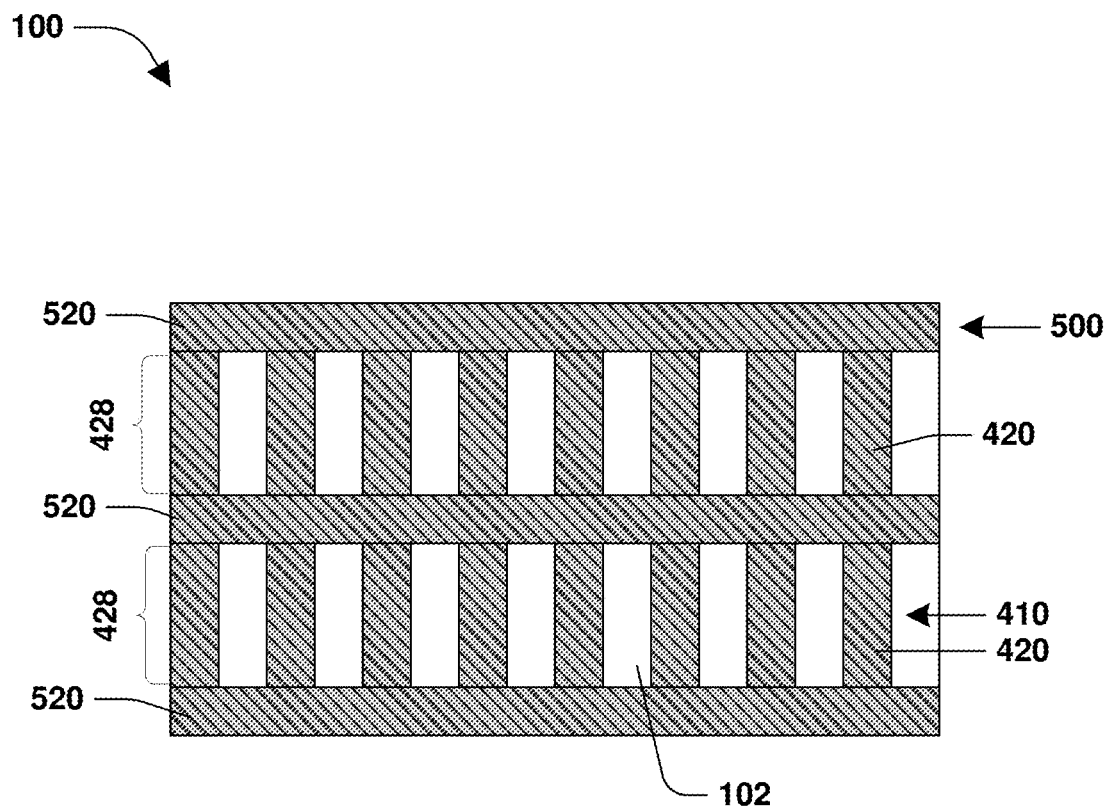
FIG. 7b illustrates patterning a first mask region and a second mask region associated with forming a semiconductor arrangement, in accordance with some embodiments.

Turning now to FIGS. 7a and 7b, in an embodiment, the first mask region 410 and the second mask region 500 are patterned. FIG. 7b is a top down view of the embodiment of FIG. 7a as viewed from a perspective indicated by lines 7b-7b in FIG. 7a. According to some embodiments, the second mask region 500 is patterned by removing the fourth mask portions 600, and the first mask region 410 is patterned by removing the fourth areas 448 (illustrated in FIG. 4b) of the second mask portions 440 under the fourth mask portions 600. In some embodiments, the fourth mask portions 600 and the fourth areas 448 of the second mask portions 440 are removed by wet etching, dry etching, etc. According to some embodiments, the etch chemistry for etching through the fourth mask portions 600 and the fourth areas 448 of the second mask portions 440 include hot phosphoric acid ($H_3PO_4$), RIE plasma, etc. In some embodiments, the second areas 444 of the second mask portions 440 are located under the third mask portions 520 and are not removed.

Figure 8A:
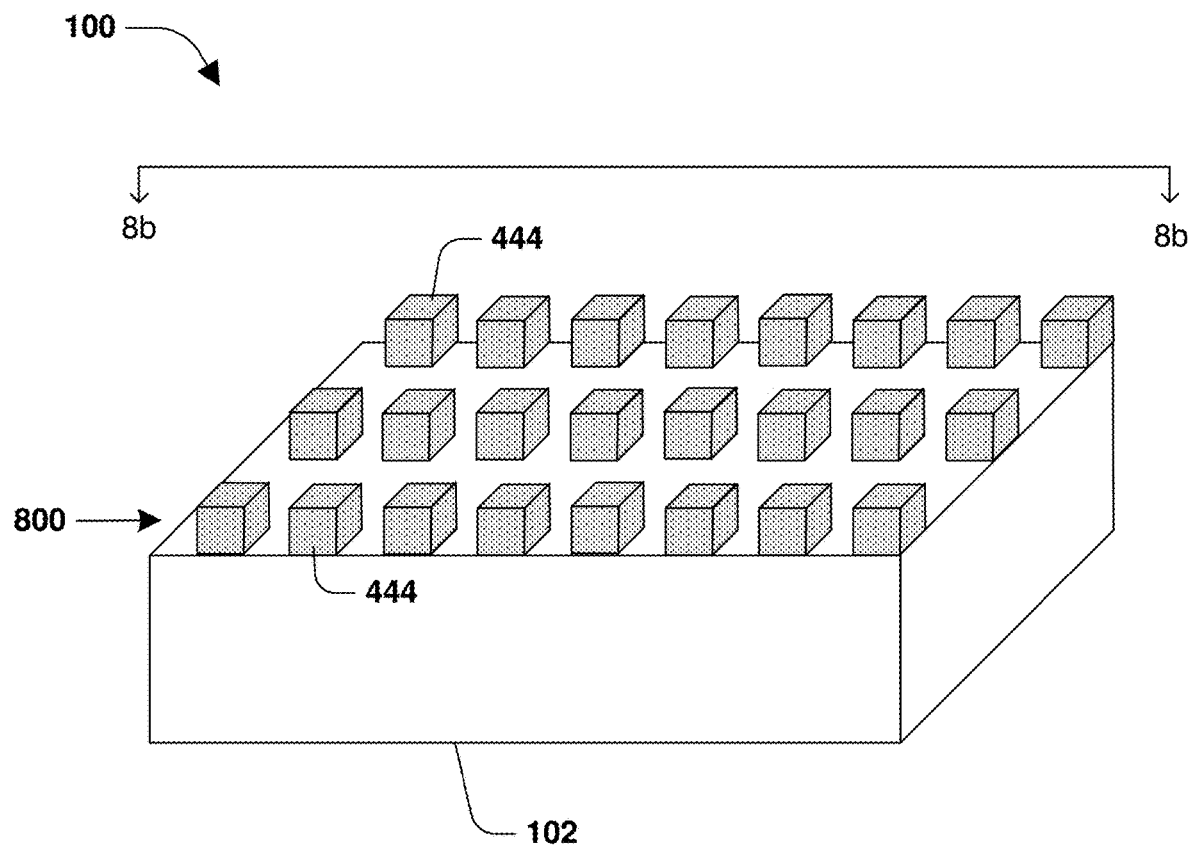
FIG. 8a illustrates patterning a first mask region and a second mask region associated with forming a semiconductor arrangement, in accordance with some embodiments.
Figure 8B:
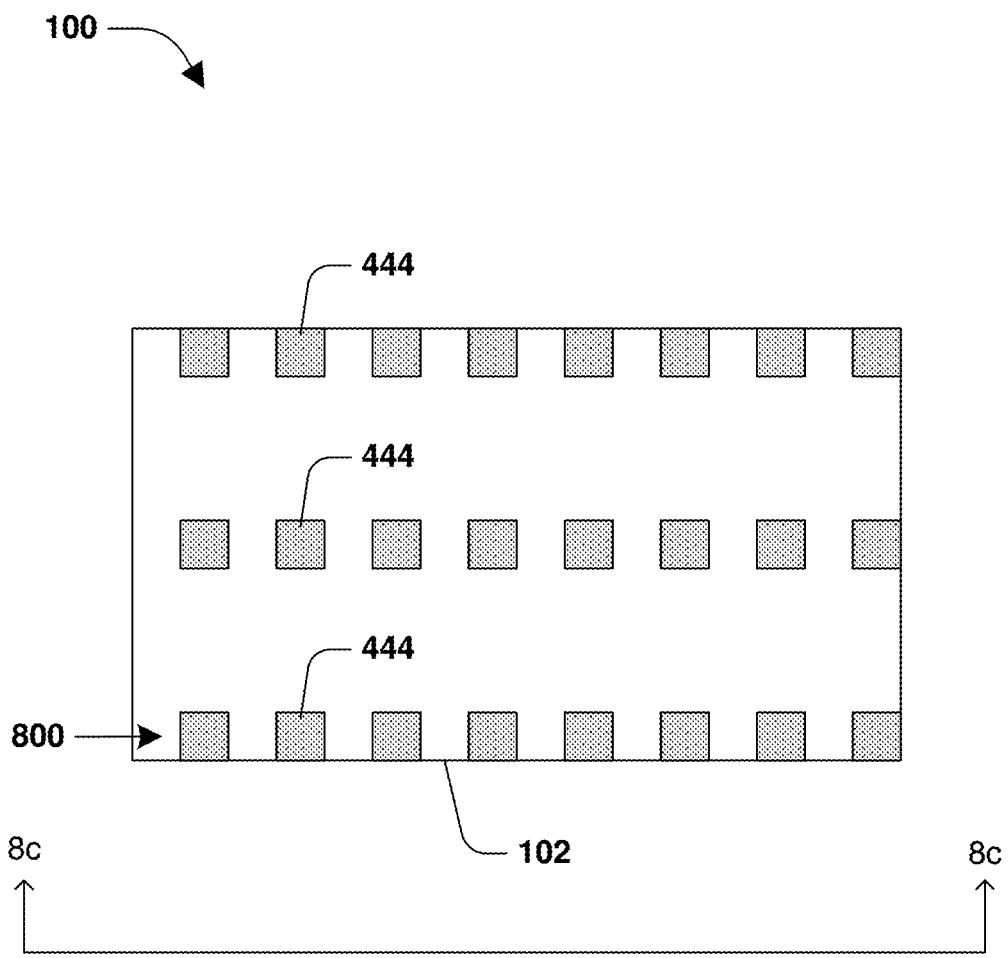
FIG. 8b illustrates patterning a first mask region and a second mask region associated with forming a semiconductor arrangement, in accordance with some embodiments.
Figure 8C:
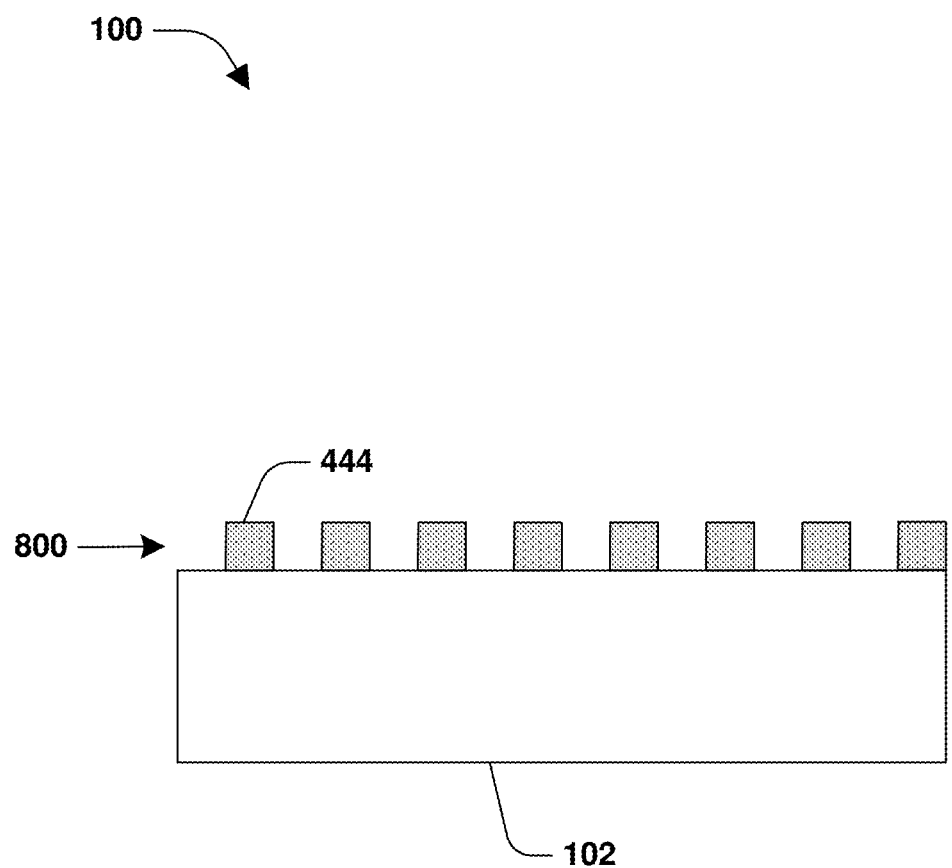
FIG. 8c illustrates patterning a first mask region and a second mask region associated with forming a semiconductor arrangement, in accordance with some embodiments.

Turning now to FIGS. 8a to 8c, in an embodiment, the second mask region 500 is patterned by removing the third mask portions 520 and the first mask region 410 is patterned by removing the first mask portions 420. FIG. 8b is a top down view of the embodiment of FIG. 8a as viewed from a perspective indicated by lines 8b-8b. FIG. 8c is a side elevation view of the embodiment of FIG. 8b as viewed from a perspective indicated by lines 8c-8c in FIG. 8b. In some embodiments, the third mask portions 520 and first mask portions 420 are removed by wet etching, dry etching, etc. According to some embodiments, the etch chemistry for etching through the third mask portions 520 and the first mask portions 420 includes hydrofluoric acid, a fluorine-containing RIE plasma, etc. In some embodiments, the second areas 444 of the second mask portions 440 are not removed. According to some embodiments, a result of the patterning of the first mask region 410 and the second mask region 500 is the formation of a first patterned mask region 800. In some embodiments, the first patterned mask region 800 comprises the second areas 444.

Figure 9:
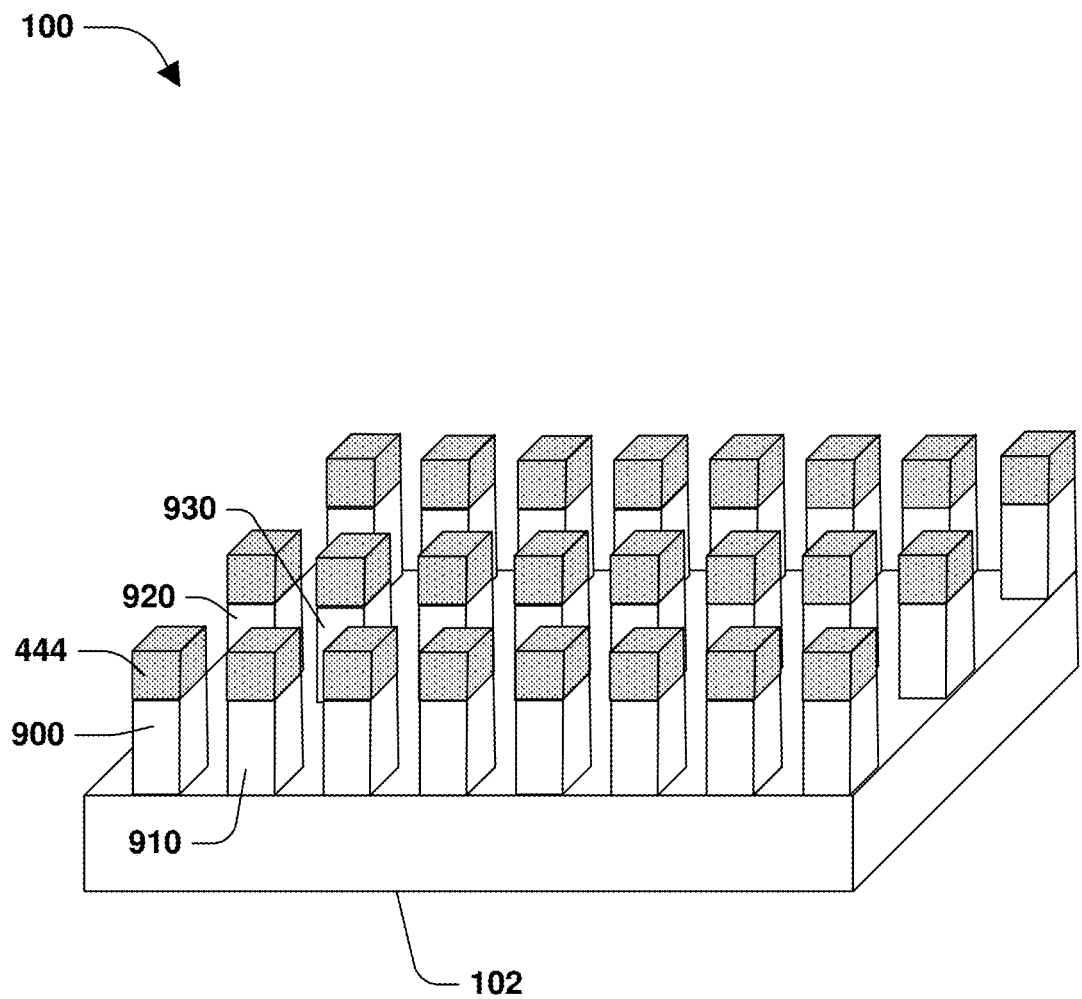
FIG. 9 illustrates a portion of a semiconductor arrangement, in accordance with some embodiments.

Turning now to FIG. 9, in an embodiment, one or more semiconductor columns are formed. According to some embodiments, a first semiconductor column 900, second semiconductor column 910, third semiconductor column 920, and fourth semiconductor column 930, are formed from the substrate region 102 under the first mask region 410. In some embodiments, the first semiconductor column 900, the second semiconductor column 910, the third semiconductor column 920, and the fourth semiconductor column 930, are formed under the second areas 444 of the second mask portions 440 of the first mask region 410.

The semiconductor columns 900, 910, 920, 930 as well as zero or more other semiconductor columns are formed in any number of ways. In some embodiments, the semiconductor columns 900, 910, 920, 930 as well as zero or more other semiconductor columns are formed by etching. In an embodiment, portions of the substrate region 102 that are not covered by the second areas 444 of the first mask portions 420 are removed to form the semiconductor columns 900, 910, 920, 930. According to some embodiments, at least one of the first semiconductor column 900, the second semiconductor column 910, the third semiconductor column 920, and the fourth semiconductor column 930 project from the substrate region 102 and comprise at least one of silicon or polysilicon.

Figure 10A:
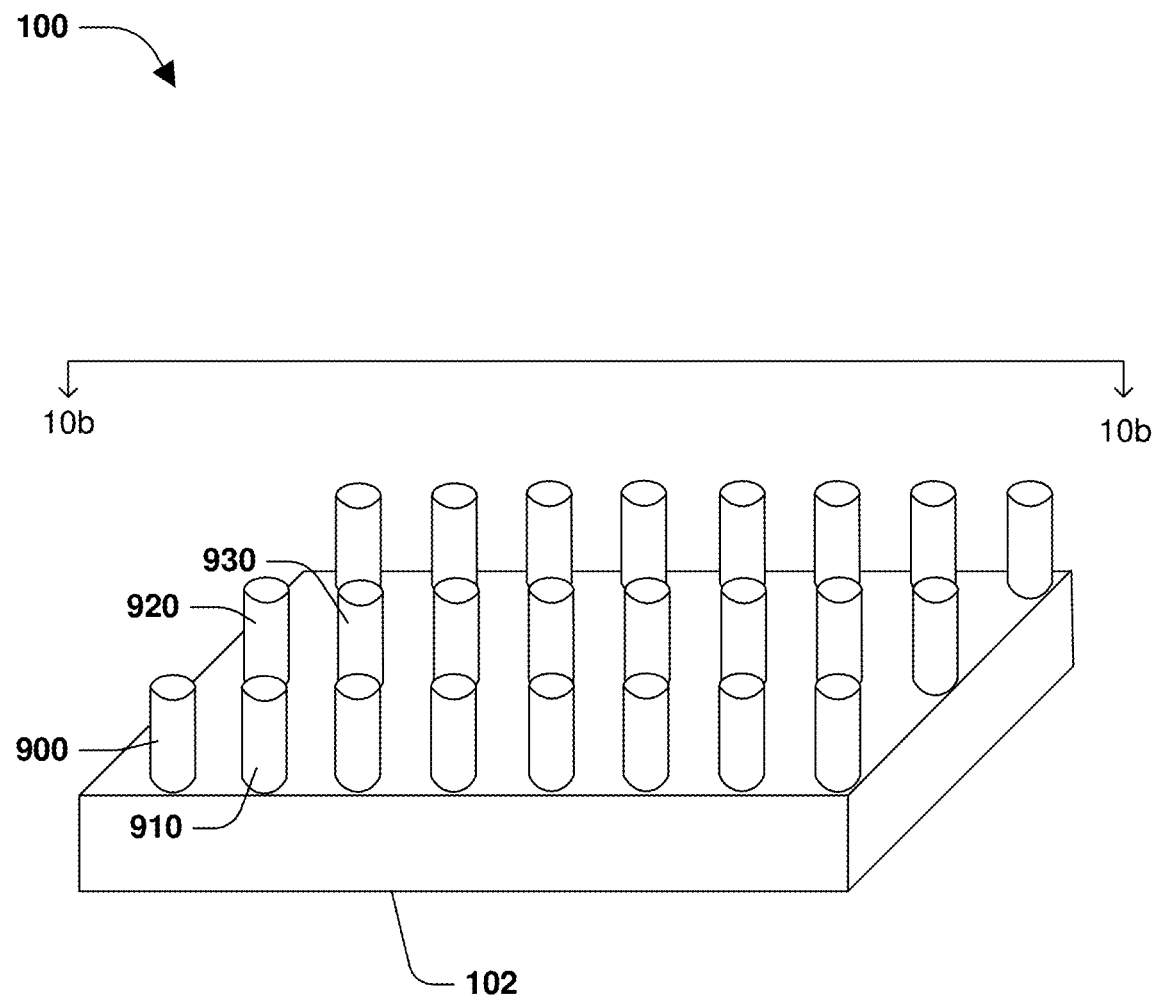
FIG. 10a illustrates a portion of a semiconductor arrangement, in accordance with some embodiments.
Figure 10B:
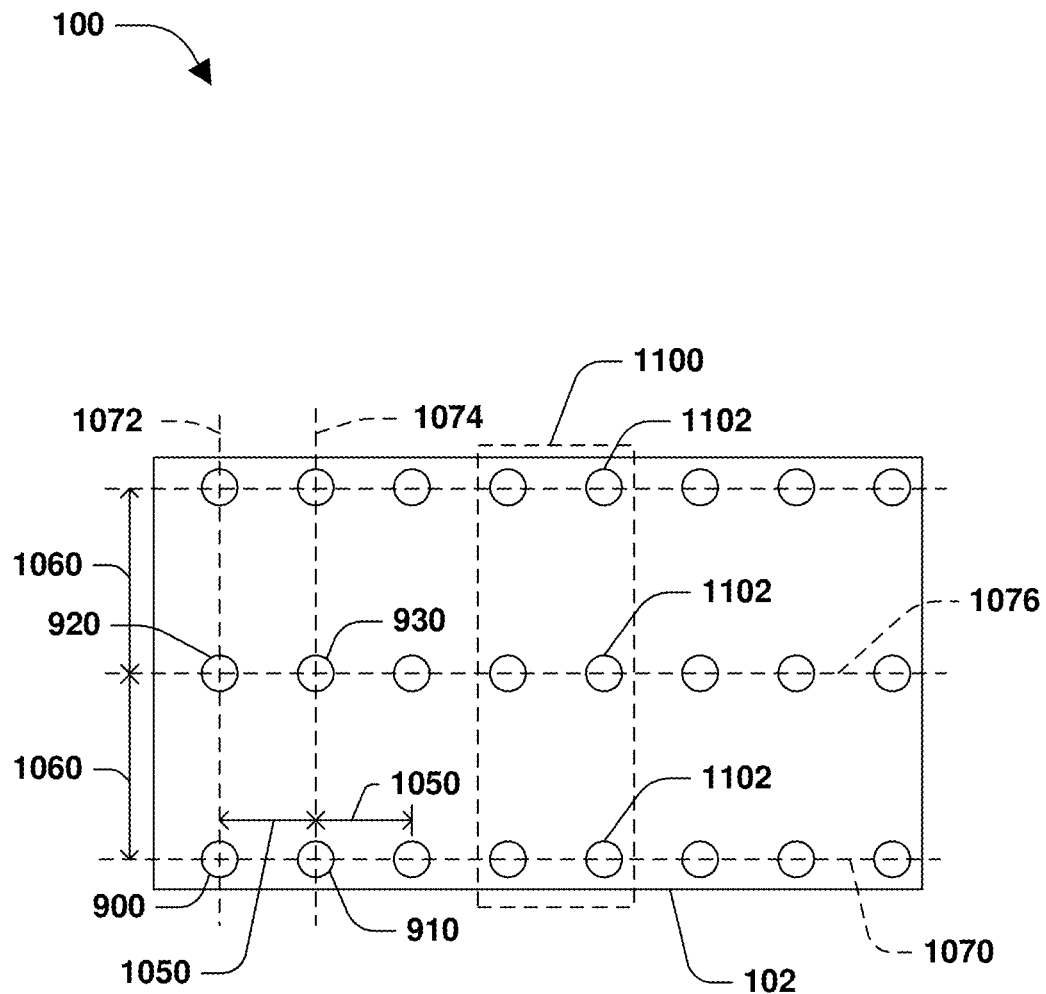
FIG. 10b illustrates a portion of a semiconductor arrangement, in accordance with some embodiments.

Turning now to FIGS. 10a and 10b, according to some embodiments, the second areas 444 of the second mask portions 440 are removed and the semiconductor columns 900, 910, 920, 930 are patterned. FIG. 10b is a top down view of the embodiment of FIG. 10a as viewed from a perspective indicated by lines 10b-10b. In an embodiment, the second areas 444 of the second mask portions 440 are removed in any number of ways, such as by etching. In some embodiments, the semiconductor columns 900, 910, 920, 930 as well as zero or more other semiconductor columns are patterned, such as by oxidization, annealing, such as in hydrogen ($H_2$), etc. In some embodiments, the semiconductor columns 900, 910, 920, 930 are patterned before the second areas 444 of the second mask portions 440 are removed. In some embodiments, the semiconductor columns 900, 910, 920, 930 are patterned after the second areas 444 of the second mask portions 440 are removed.

According to some embodiments, at least one of the semiconductor columns 900, 910, 920, 930, as well as zero or more other semiconductor columns are patterned such that a cross-section of the semiconductor columns 900, 910, 920, 930 is substantially circular. In an embodiment, a cross-section of the first semiconductor column 900 is substantially circular. In an embodiment, a cross-section of the second semiconductor column 910 is substantially circular. In an embodiment, a cross-section of the third semiconductor column 920 is substantially circular. In an embodiment, a cross-section of the fourth semiconductor column 930 is substantially circular.

As illustrated in FIG. 10b, according to some embodiments, the second semiconductor column 910 is separated a first distance 1050 from the first semiconductor column 900. According to some embodiments, the first distance 1050 is between about 10 nm to about 30 nm. In an embodiment, the first distance 1050 is about 20 nm. According to some embodiments, the second semiconductor column 910 is separated the first distance 1050 from the first semiconductor column 900 along a first axis 1070.

According to some embodiments, the third semiconductor column 920 is separated a second distance 1060 from the first semiconductor column 900. In some embodiments, the second distance 1060 is different than the first distance 1050. In some embodiments, the first distance 1050 is less than the second distance 1060. According to some embodiments, the second distance 1060 is between about 30 nm to about 50 nm. In an embodiment, the second distance 1060 is about 40 nm. According to some embodiments, the third semiconductor column 920 is separated the second distance 1060 from the first semiconductor column 900 along a second axis 1072. In an embodiment, the second axis 1072 is substantially perpendicular to the first axis 1070.

According to some embodiments, the fourth semiconductor column 930 is separated the second distance 1060 from the second semiconductor column 910. According to some embodiments, the fourth semiconductor column 930 is separated the second distance 1060 from the second semiconductor column 910 along a third axis 1074. In an embodiment, the third axis 1074 is substantially perpendicular to the first axis 1070. In an embodiment, the third axis 1074 is substantially parallel to the second axis 1072.

According to some embodiments, the fourth semiconductor column 930 is separated the first distance 1050 from the third semiconductor column 920. According to some embodiments, the fourth semiconductor column 930 is separated the first distance 1050 from the third semiconductor column 920 along a fourth axis 1076. In an embodiment, the fourth axis 1076 is substantially perpendicular to the second axis 1072. In an embodiment, the fourth axis 1076 is substantially parallel to the first axis 1070.

In some embodiments, the second semiconductor column 910 is adjacent the first semiconductor column 900 such that zero semiconductor columns are located between the first semiconductor column 900 and the second semiconductor column 910 along the first axis 1070. In some embodiments, the third semiconductor column 920 is adjacent the first semiconductor column 900 such that zero semiconductor columns are located between the first semiconductor column 900 and the third semiconductor column 920 along the second axis 1072. In some embodiments, the fourth semiconductor column 930 is adjacent the second semiconductor column 910 such that zero semiconductor columns are located between the second semiconductor column 910 and the fourth semiconductor column 930 along the third axis 1074. In some embodiments, the fourth semiconductor column 930 is adjacent the third semiconductor column 920 such that zero semiconductor columns are located between the third semiconductor column 920 and the fourth semiconductor column 930 along the fourth axis 1076.

According to some embodiments, the first semiconductor column 900, the second semiconductor column 910, the third semiconductor column 920, and the fourth semiconductor column 930 are disposed within an area defined by the first distance 1050 times the second distance 1060. In some embodiments, the area is between about 500 nm$^2$ to about 700 nm$^2$.

Figure 11:
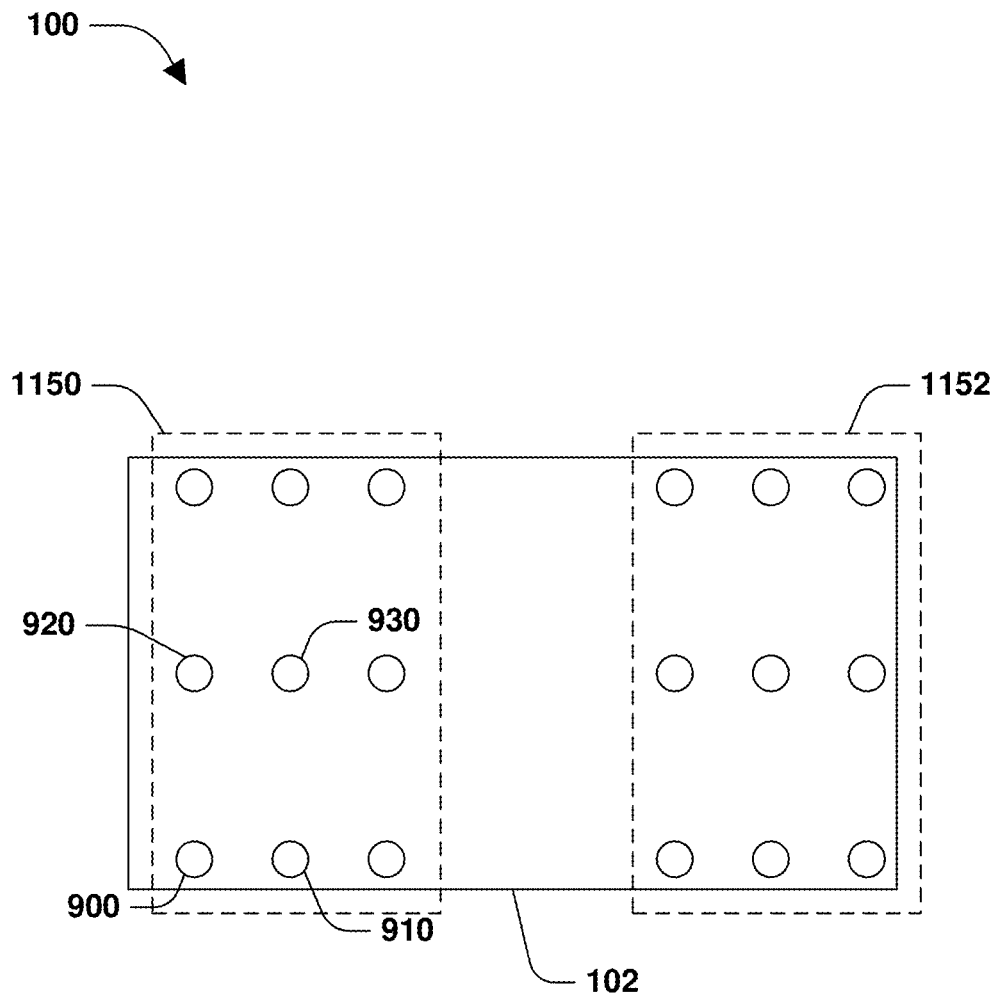
FIG. 11 illustrates a portion of a semiconductor arrangement, in accordance with some embodiments.

Turning now to FIG. 11, according to some embodiments, a group 1100 of semiconductor columns 1102, illustrated in FIG. 10b, is removed. In some embodiments, the group 1100 of semiconductor columns 1102 is removed by wet etching, dry etching, etc. In an embodiment, the group 1100 comprises six semiconductor columns 1102 disposed near a center of the semiconductor arrangement 100.

According to some embodiments, after the group 1100 of semiconductor columns 1102 is removed, the semiconductor arrangement 100 comprises a first group 1150 of semiconductor columns and a second group 1152 of semiconductor columns. In an embodiment, the first group 1150 of semiconductor columns comprises six semiconductor columns and defines a first area of between about 4500 nm$^2$ to about 5500 nm$^2$. In an embodiment, the first group 1150 of semiconductor columns defines the first area of about 4900 nm$^2$. In some embodiments, the second group 1152 of semiconductor columns comprises six semiconductor columns and defines a second area of between about 4500 nm$^2$ to about 5500 nm$^2$. In an embodiment, the second group 1152 of semiconductor columns defines the second area of about 4900 nm$^2$.

Figure 12:
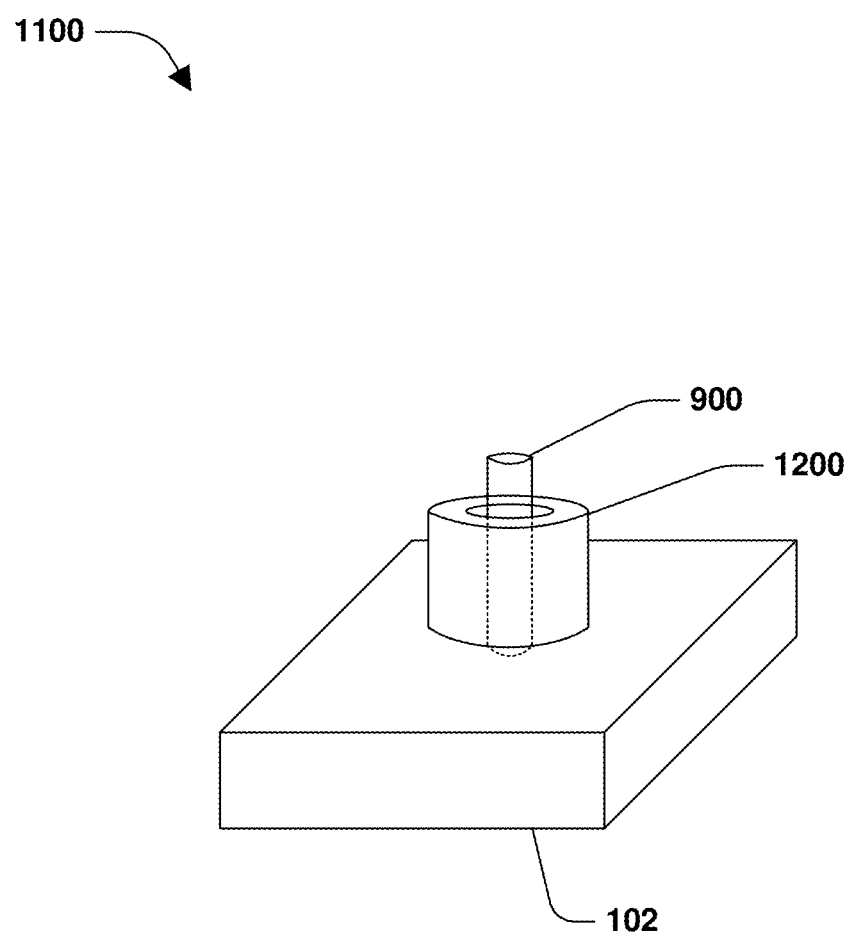
FIG. 12 illustrates a portion of a semiconductor arrangement, in accordance with some embodiments.

Turning now to FIG. 12, in an embodiment, a gate electrode 1200 is formed around at least some of the semiconductor columns 900, 910, 920, 930 as well as zero or more other semiconductor columns. In an embodiment, the gate electrode 1200 is formed around at least some of the first semiconductor column 900. According to some embodiments, the gate electrode 1200 wraps around the entire circumference or perimeter of the first semiconductor column 900, such that the semiconductor arrangement 100 comprises a vertical gate all around (VGAA) transistor. According to some embodiments, the gate electrode 1200 wraps around a portion of the circumference or perimeter of the first semiconductor column 900. In some embodiments, the first semiconductor column 900 functions as a channel of a transistor.

According to some embodiments, the substrate region under the first group 1150 of semiconductor columns illustrated in FIG. 11 has at least one of a p type doping concentration or an n type doping concentration such that the first group 1150 of semiconductor columns are part of a multi-channel p type transistor or part of a multi-channel n type transistor. According to some embodiments, the substrate region under the second group 1152 of semiconductor columns illustrated in FIG. 11 has at least one of a p type doping concentration or an n type doping concentration such that the second group 1152 of semiconductor columns are part of a multi-channel p type transistor or part of a multi-channel n type transistor. According to some embodiments, a multi-channel transistor has nine channels. Different type transistors and/or transistors having a different number of channels are within the scope of various embodiments.

Turning now to FIGS. 13a to 13d, in some embodiments, the semiconductor columns 900, 910, 920, 930 are not limited to the cylindrical shape having a substantially circular cross-section illustrated in FIGS. 10a, 10b, 11 and 12. As illustrated in FIG. 13a, according to some embodiments, some or all of the semiconductor columns 900, 910, 920, 930, and zero or more columns, of the semiconductor arrangement 100 comprise a first semiconductor column 1300a. In an embodiment, the first semiconductor column 1300a comprises a substantially square or rectangular shape having a substantially quadrilateral cross-section. FIG. 13b illustrates a top down view of a first semiconductor column 1300b. According to some embodiments, some or all of the semiconductor columns of the semiconductor arrangement 100 comprise the first semiconductor column 1300b. In an embodiment, the first semiconductor column 1300b comprises a substantially square or rectangular shape with rounded corners.

As illustrated in FIG. 13c, according to some embodiments, some or all of the semiconductor columns 900, 910, 920, 930 of the semiconductor arrangement 100 as well as zero or more other semiconductor columns comprise a first semiconductor column 1300c. According to some embodiments, a first cross-sectional size 1350 at a first location 1352 along the first semiconductor column 1300c is less than a second cross-sectional size 1360 at a second location 1362 along the first semiconductor column 1300c. In an embodiment, an end 1364 of the first semiconductor column 1300c is larger than a center portion 1366 of the first semiconductor column 1300c. In some embodiments, the first semiconductor column 1300c comprises a substantially cylindrical shape, such that the first cross-sectional size 1350 and second cross-sectional size 1360 comprise a diameter. In some embodiments, the first semiconductor column 1300c comprises a substantially square or rectangular shape.

As illustrated in FIG. 13d, according to some embodiments, some or all of the semiconductor columns 900, 910, 920, 930 of the semiconductor arrangement 100 as well as zero or more other semiconductor columns comprise a first semiconductor column 1300d. According to some embodiments, the first cross-sectional size 1350 at the first location 1352 along the first semiconductor column 1300c is less than the second cross-sectional size 1360 at the second location 1362 along the first semiconductor column 1300d. In an embodiment, ends 1374 of the first semiconductor column 1300d are larger than a center portion 1376 of the first semiconductor column 1300d. In some embodiments, the first semiconductor column 1300*d* comprises a substantially cylindrical shape, such that the first cross-sectional size 1350 and second cross-sectional size 1360 comprise a diameter. In some embodiments, the first semiconductor column 1300*d* comprises a substantially square or rectangular shape.

According to some embodiments, at least one of the first group 1150 of semiconductor columns or the second group 1152 of semiconductor columns illustrated in FIG. 11 have more semiconductor columns per unit area than a corresponding area of semiconductor columns that does not have semiconductor columns formed as provided herein. According to some embodiments, at least one of the first group 1150 of semiconductor columns or the second group 1152 of semiconductor columns have an increased density of semiconductor columns per unit area of about 34% as compared to a corresponding area of semiconductor columns that does not have semiconductor columns formed as provided herein. In some embodiments, this increased density provides a capacitance reduction benefit. In some embodiments, this increased density provides a decrease of gate capacitance per constant current. In some embodiments, this increased density provides an increased gate density and thus an increased power per unit area where the current per semiconductor column or transistor channel is substantially constant. In an embodiment, the second semiconductor column 910 is separated the first distance 1050 from the first semiconductor column 900. In an embodiment, the first distance is between about 10 nm to about 30 nm. In an embodiment, the third semiconductor column 920 is separated the second distance 1060 from the first semiconductor column 900. In an embodiment, the second distance 1060 is between about 30 nm to about 50 nm.

In an embodiment, a semiconductor arrangement comprises a substrate region. In an embodiment, the semiconductor arrangement comprises a first semiconductor column projecting from the substrate region. In an embodiment, the semiconductor arrangement comprises a second semiconductor column projecting from the substrate region and adjacent the first semiconductor column, the second semiconductor column separated a first distance from the first semiconductor column along a first axis. In an embodiment, the semiconductor arrangement comprises a third semiconductor column projecting from the substrate region and adjacent the first semiconductor column. In an embodiment, the third semiconductor column is separated a second distance from the first semiconductor column along a second axis that is substantially perpendicular to the first axis. In an embodiment, the second distance is different than the first distance.

In an embodiment, a semiconductor arrangement comprises a substrate region. In an embodiment, the semiconductor arrangement comprises a first semiconductor column projecting from the substrate region. In an embodiment, the semiconductor arrangement comprises a second semiconductor column projecting from the substrate region. In an embodiment, the second semiconductor column is separated a first distance from the first semiconductor column along a first axis. In an embodiment, the first distance is between about 10 nm to about 30 nm. In an embodiment, the semiconductor arrangement comprises a third semiconductor column projecting from the substrate region and adjacent the first semiconductor column. In an embodiment, the third semiconductor column is separated a second distance from the first semiconductor column along a second axis that is substantially perpendicular to the first axis. In an embodiment, the second distance is between about 30 nm to about 50 nm.

In an embodiment, a method of forming a semiconductor arrangement comprises forming a first mask region over a substrate region. In an embodiment, the method comprises forming a second mask region over the first mask region. In an embodiment, the method comprises patterning the first mask region and the second mask region to form a first patterned mask region. In an embodiment, the method comprises using the first patterned mask region to form a first semiconductor column, a second semiconductor column, and a third semiconductor column from the substrate region. In an embodiment, the second semiconductor column is adjacent the first semiconductor column and separated a first distance from the first semiconductor column along a first axis. In an embodiment, the third semiconductor column is adjacent the first semiconductor column and separated a second distance from the first semiconductor column along a second axis that is substantially perpendicular to the first axis. In an embodiment, the second distance is different than the first distance.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as etching techniques, planarization techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
    forming a first mask structure and a second mask structure over a substrate, wherein:
        the first mask structure and the second mask structure extend in a first direction, and
        the first mask structure and the second mask structure are made of a first mask material;
    forming a third mask structure between the first mask structure and the second mask structure, wherein the third mask structure is made of a second mask material different than the first mask material;
    forming a fourth mask structure between the third mask structure and the second mask structure after forming the third mask structure, wherein the fourth mask structure is made of the first mask material; and
    forming a fifth mask structure and a sixth mask structure over the first mask structure and the fourth mask structure, wherein:
        the fifth mask structure and the sixth mask structure extend in a second direction different than the first direction,
        the fifth mask structure and the sixth mask structure are made of the first mask material,
        the first mask structure and the fourth mask structure have a first pitch, and
        the fifth mask structure and the sixth mask structure have a second pitch different than the first pitch.

2. The method of claim 1, wherein the second pitch is greater than the first pitch.

3. The method of claim 1, wherein the second direction is perpendicular to the first direction.

4. The method of claim 1, wherein forming the fifth mask structure and the sixth mask structure comprises forming the fifth mask structure and the sixth mask structure over the third mask structure.

5. The method of claim 4, comprising:
    removing a first portion of the third mask structure between the first mask structure and the fourth mask structure that is not concealed by either of the fifth mask structure or the sixth mask structure.

6. The method of claim 5, comprising:
    removing the first mask structure, the fourth mask structure, the fifth mask structure, and the sixth mask structure to expose a second portion of the third mask structure after removing the first portion of the third mask structure.

7. The method of claim 6, comprising:
    etching a first portion of the substrate after removing the first mask structure, the fourth mask structure, the fifth mask structure, and the sixth mask structure, wherein the second portion of the third mask structure masks a second portion of the substrate.

8. The method of claim 7, wherein etching the first portion of the substrate after removing the first mask structure, the fourth mask structure, the fifth mask structure, and the sixth mask structure comprises:
    defining a semiconductor column underlying the second portion of the third mask structure from the second portion of the substrate.

9. The method of claim 1,
    forming the fifth mask structure and the sixth mask structure comprises forming the fifth mask structure and the sixth mask structure over the third mask structure, and
    the method comprises removing a first portion of the third mask structure between the first mask structure and the fourth mask structure that is not concealed by either of the fifth mask structure or the sixth mask structure.

10. The method of claim 9, comprising:
    removing the first mask structure, the fourth mask structure, the fifth mask structure, and the sixth mask structure to expose a second portion of the third mask structure after removing the first portion of the third mask structure; and
    etching a first portion of the substrate after removing the first mask structure, the fourth mask structure, the fifth mask structure, and the sixth mask structure, wherein the second portion of the third mask structure masks a second portion of the substrate.

11. The method of claim 1, comprising:
    defining a semiconductor column from a portion of the substrate underlying the fifth mask structure but not underlying either of the first mask structure or the fourth mask structure.

12. A method of forming a semiconductor arrangement, comprising:
    forming a first mask structure and a second mask structure over a substrate, wherein:
        the first mask structure and the second mask structure extend in a first direction, and
        the first mask structure and the second mask structure are made of a first mask material;
    forming a third mask structure between the first mask structure and the second mask structure, wherein the third mask structure is made of a second mask material different than the first mask material;
    forming a fourth mask structure between the third mask structure and the second mask structure after forming the third mask structure, wherein the fourth mask structure is made of the first mask material;
forming a fifth mask structure and a sixth mask structure over the first mask structure and the fourth mask structure, wherein:
the fifth mask structure and the sixth mask structure extend in a second direction different than the first direction,
the first mask structure and the fourth mask structure have a first pitch, and
the fifth mask structure and the sixth mask structure have a second pitch different than the first pitch;
defining a first set of semiconductor columns from a first portion of the substrate underlying the fifth mask structure but not underlying either of the first mask structure or the fourth mask structure; and
defining a second set of semiconductor columns from a second portion of the substrate underlying the sixth mask structure but not underlying either of the first mask structure or the fourth mask structure.

13. The method of claim 12, wherein defining the second set of semiconductor columns comprises defining the second set of semiconductor columns concurrently with defining the first set of semiconductor columns.

14. The method of claim 12, wherein:
the first set of semiconductor columns are arranged in a first row extending in the second direction,
the second set of semiconductor columns are arranged in a second row extending in the second direction, and
the first row and the second row have the second pitch.

15. The method of claim 12, wherein
forming the fifth mask structure and the sixth mask structure comprises forming the fifth mask structure and the sixth mask structure over the third mask structure.

16. The method of claim 15, wherein:
upon forming the fifth mask structure and the sixth mask structure, a first portion of the third mask structure underlies the fifth mask structure and a second portion of the third mask structure underlies the sixth mask structure,
defining the first set of semiconductor columns comprises defining a first semiconductor column of the first set of semiconductor columns using the first portion of the third mask structure, and
defining the second set of semiconductor columns comprises defining a first semiconductor column of the second set of semiconductor columns using the second portion of the third mask structure.

17. The method of claim 16, comprising:
removing a third portion of the third mask structure between the first portion of the third mask structure and the second portion of the third mask structure before defining the first set of semiconductor columns and before defining the second set of semiconductor columns.

18. A method of forming a semiconductor arrangement, comprising:
forming a first mask structure and a second mask structure over a substrate, wherein:
the first mask structure and the second mask structure extend in a first direction, and
the first mask structure and the second mask structure are made of a first mask material;
forming a third mask structure between the first mask structure and the second mask structure, wherein the third mask structure is made of a second mask material different than the first mask material;
forming a fourth mask structure between the third mask structure and the second mask structure after forming the third mask structure, wherein the fourth mask structure is made of the first mask material;
forming a fifth mask structure and a sixth mask structure over the first mask structure and the fourth mask structure, wherein:
the fifth mask structure and the sixth mask structure extend in a second direction different than the first direction, and
the fifth mask structure and the sixth mask structure are made of the first mask material;
defining a first set of semiconductor columns from a first portion of the substrate underlying the fifth mask structure but not underlying either of the first mask structure or the fourth mask structure; and
defining a second set of semiconductor columns from a second portion of the substrate underlying the sixth mask structure but not underlying either of the first mask structure or the fourth mask structure.

19. The method of claim 18, wherein one of the first mask material or the second mask material comprises $SiO_2$ and the other of the first mask material or the second mask material comprises $Si_3N_3$.

20. The method of claim 18, wherein one of the first mask material or the second mask material comprises an oxide and the other of the first mask material or the second mask material comprises a nitride.

* * * * *